United States Patent
Chen et al.

(10) Patent No.: US 6,570,415 B2
(45) Date of Patent: May 27, 2003

(54) REDUCED VOLTAGE SWING DIGITAL DIFFERENTIAL DRIVER

(75) Inventors: Hao Chen, Dallas, TX (US); Rolf Lagerquist, Richardson, TX (US); Hugh Mair, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/158,659

(22) Filed: May 30, 2002

(65) Prior Publication Data

US 2002/0186059 A1 Dec. 12, 2002

Related U.S. Application Data

(60) Provisional application No. 60/296,424, filed on Jun. 6, 2001.

(51) Int. Cl.[7] .................................................. H03B 1/00
(52) U.S. Cl. ...................... 327/108; 327/563; 327/65; 327/206; 326/83
(58) Field of Search ........................ 327/108–112, 170, 327/389, 391, 427, 63–65, 562, 563, 205, 206, 374, 376, 377; 326/83; 330/253

(56) References Cited

U.S. PATENT DOCUMENTS

| | | | |
|---|---|---|---|
| 4,571,504 A | * 2/1986 | Iwamoto et al. | ............ 327/206 |
| 5,429,442 A | 7/1995 | Schrader | ................. 400/157.3 |
| 5,973,526 A | 10/1999 | Dabral | ........................ 327/170 |
| 6,130,562 A | * 10/2000 | Bosch et al. | ................ 327/109 |
| 6,198,307 B1 | 3/2001 | Garlepp et al. | ............... 326/83 |
| 6,433,602 B1 | * 8/2002 | Lall et al. | ................... 327/205 |

* cited by examiner

Primary Examiner—Terry D. Cunningham
Assistant Examiner—Long Nguyen
(74) Attorney, Agent, or Firm—April M. Mosby; Wade James Brady, III; Frederick J. Telecky, Jr.

(57) ABSTRACT

A predriver for a differential pair having a reduce voltage swing is disclosed having fast switching speed and low power consumption. The predriver includes a p-type MOS transistor, and a first and second n-type MOS transistor. The source of the p-type MOS couples to the first power supply rail. The gate of the first n-type MOS transistor couples to the gate of the p-type MOS transistor to form an input. The drain of the first n-type MOS transistor couples to the drain of the p-type MOS transistor to form an output. The drain of the second n-type MOS transistor couples to the source of the first n-type MOS transistor. The source of the second n-type MOS transistor couples to ground. The gate of the second n-type MOS transistor couples to the output. The presence of the second n-type MOS transistor alters the voltage swing of the predriver to be from the threshold voltage level to the full power supply voltage, substantially reducing the current or power consumption.

1 Claim, 1 Drawing Sheet

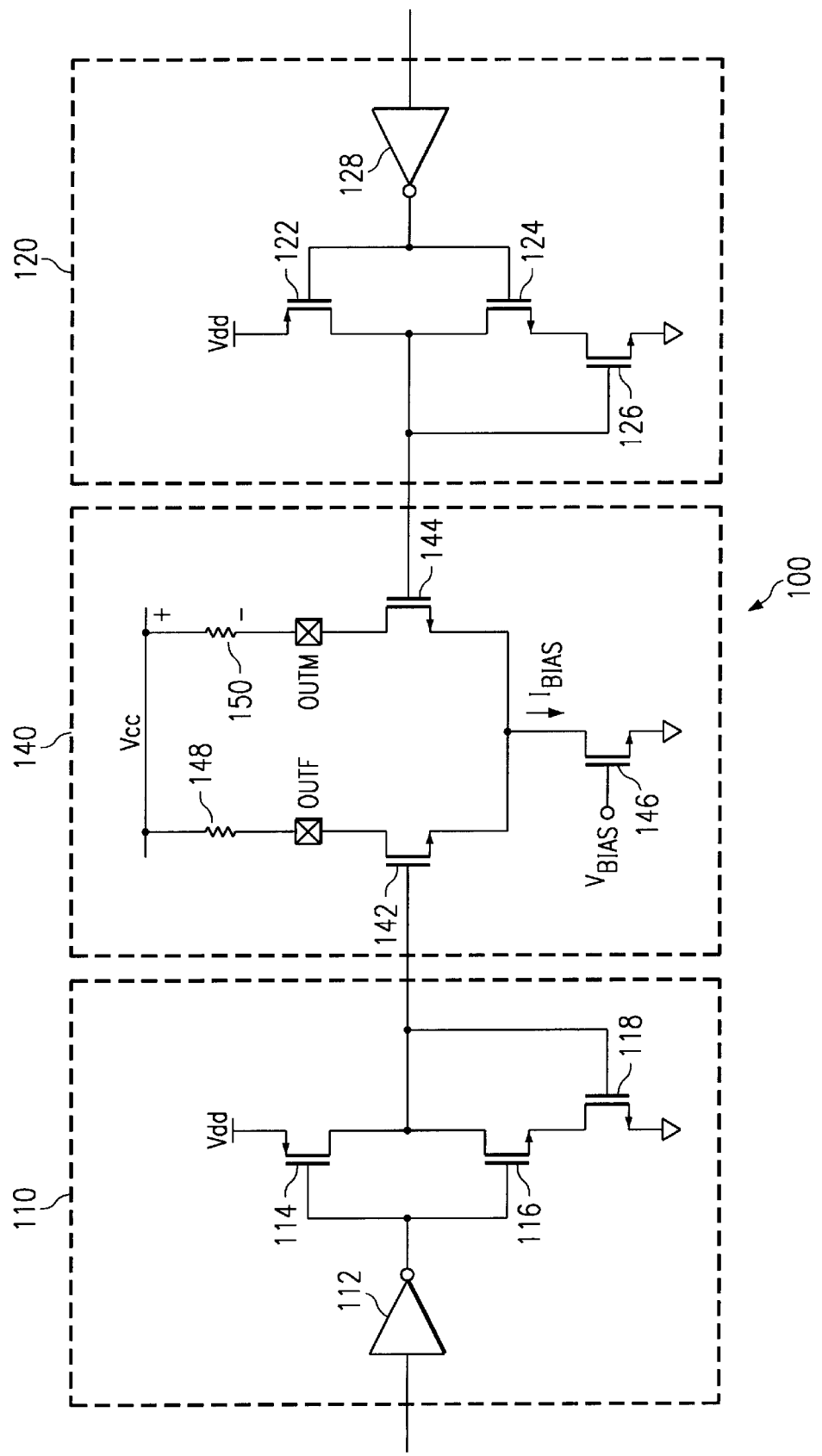

REDUCED VOLTAGE SWING DIGITAL DIFFERENTIAL DRIVER

This application claims priority under 35 USC §119(e)(1) of provisional application Serial No. 60/296,424, filed Jun. 6, 2001.

FIELD OF THE INVENTION

The present invention relates to predrivers, and, more particularly, to a reduced voltage swing digital differential driver.

BACKGROUND OF THE INVENTION

Predrivers drive the inputs of a differential comparator to a specified level. Conventional predrivers include an inverter connected to a p-type MOS transistor and a n-type MOS transistor. The gates of the p-type and n-type MOS transistors connect to each other and to the inverter. The drains of the p-type and n-type MOS transistors connect to each other respectively to form an output. The source of the p-type MOS transistor connects to the power supply rail while the source of the n-type MOS transistor connects to ground. In operation when the input represents a high voltage or a '1', the p-type MOS transistor switches on and current flows from the power supply rail through the p-type MOS transistor to pull the output node of the predriver high. When the input represents a low voltage or a '0', the n-type MOS transistor switches on and current flows through the n-type MOS transistor to ground, pulling the output node of the predriver low.

Since the signals sent to the input are digital, the voltage at the output swings from ground to the full power supply voltage level. As a result, the switching speed is slow and high current or power consumption exist.

There, however, exists a need for a predriver that has faster switching speed and low current or power consumption.

SUMMARY OF THE INVENTION

To address the above-discussed deficiencies of predrivers, the present invention teaches a predriver circuit for a differential comparator having a first and second power supply rail. The predriver circuit, having an input and an output, includes an inverter connected to the input and a p-type MOS transistor having a drain, a source and a gate, whereby the source is coupled to the first power supply rail and the gate is coupled to the inverter. A first n-type MOS transistor, having a drain, source and a gate, couples to the p-type MOS transistor. The gate of the n-type MOS transistor couples to the gate of the p-type MOS transistor. The drain of the first n-type MOS transistor couples to the drain of the p-type MOS transistor to form an output. A second n-type MOS transistor, having a drain, a source, and a gate, couples to the first n-type MOS transistor. The drain of the second n-type MOS transistor couples to the source of the first n-type MOS transistor. The source of the second n-type MOS transistor couples to ground. The gate of the second n-type MOS transistor couples to the output. The presence of the second n-type MOS transistor alters the voltage swing of the predriver to be from the threshold voltage level to the full power supply voltage as oppose to from ground to the full power supply voltage which substantially reduces current or power consumption.

Advantages of this design include but are not limited to an predriver having a high performance, simple, and cost effective design.

BRIEF DESCRIPTION OF THE DRAWING

For a more complete understanding of the present invention and the advantages thereof, reference is now made to the following description taken in conjunction with the accompanying drawing in which like reference numbers indicate like features and wherein:

FIG. 1 is a schematic of an embodiment of a reduced voltage swing digital differential comparator having a predriver in accordance with the present invention.

DETAILED DESCRIPTION OF THE PREFERRED EMBODIMENTS

Circuit 100 includes a first and second predriver 110 and 120 and a differential pair circuit 140. Predriver 110 includes an inverter 112 coupled to the gates of a p-type and n-type MOS transistor, 114 and 116. The drains of p-type and n-type transistors 114 and 116 coupled to form an output for the predriver 110. The source of transistor 114 couples to a power supply line and the drain of transistor 114 couples to the drain of transistor 116. The source of transistor 116 couples to the drain of transistor 118. The source of transistor 118 couples to ground and the gate of transistor 118 couples to the drain of transistor 114. Predriver 120 is configured in the same fashion as predriver 110 using transistors 122, 124 and 126 and inverter 128.

Differential amplifier 140 of a known design includes a first, second, and third n-type MOS transistor, 142, 144, and 146. Resistors 148 and 150 couple between the first power supply rail and the drains of transistors 142 and 144, respectively. The sources of transistors 142 and 144 couple to the drain of transistor 146. The source of transistor 146 couples to ground. The gate of transistor 146 provides a bias voltage $V_{bias}$. The gates of transistors 142 and 144 form differential voltage input nodes, INM and INP. Differential voltage output nodes, OUTP and OUTM, connect to the drains of transistors 142 and 144, respectively.

In operation, the differential pair 140 shown above is used as a differential transmitter. Since the signals that are sent to the input MOS gates, 142 and 144, are digital, the voltage swings will be from ground to the full power supply $V_{DD}$. It can be observed that the input voltages to the MOS gates, 142 and 144, need not go as low as ground for the tail current to completely switch to one side. Therefore, predriver, 110 and 120, are designed such that when the input MOS gate, 142 or 144, voltage reaches approximately the threshold voltage $V_T$, the feedback from the MOS gate, 142 or 144, disables the discharge path. On the next charging cycle, the MOS gate will only need to be charged starting from the threshold voltage $V_T$ instead of ground. This reduces the current consumption taken from the predriver power supply VDD. Due to this reduction in voltage swing, the switching speed will also be greatly improved. In addition, the reduced swing will cause the two MOS inputs, INP and INM, to overlap at a much higher voltage and therefore prevent the tail current transistor from being crushed. As a result, a smoother transition exists when switching the tail current from one side to the other.

Advantages of this design include but are not limited to a predriver having a high performance, simple, and cost effective design.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A digital differential driver, comprising:
    a differential amplifier having a first and second power supply rail, comprises
        a first resistive element coupled to the first power supply rail,
        a first n-type MOS transistor having a gate, a drain and a source, the first resistive element coupled to the drain of the first n-type MOS transistor,
        a second resistive element coupled to the first power supply rail,
        a second n-type MOS transistor having a gate, a drain and a source, the second resistive element coupled to the drain of the second n-type MOS transistor, the source of the first n-type MOS transistor coupled to the source of the second n-type MOS transistor, and
        a current source coupled between the source of the second n-type MOS transistor and the second power supply rail;
    a first predriver having an input and an output, the output coupled to the gate of the first n-MOS transistor; and
    a second predriver having an input and an output, the output coupled to the gate of the second n-MOS transistor;
    wherein each of the first and second predriver comprises,
        an inverter coupled to the input,
        a p-type MOS transistor having a drain, a source and a gate, the source coupled to the first power supply rail, the gate coupled to the inverter;
        a third n-type MOS transistor having a drain, a source and a gate, the gate coupled to the gate of the p-type MOS transistor, the drain coupled to the drain of the p-type MOS transistor to form the output; and
        a fourth n-type MOS transistor having a drain, a source, and a gate, the drain coupled to the source of the third n-type MOS transistor, the source coupled to the second power supply rail, the gate coupled to the drain of the p-type MOS transistor.

* * * * *